(12) United States Patent
Schwarzenbach et al.

(10) Patent No.: US 6,919,107 B2
(45) Date of Patent: Jul. 19, 2005

(54) METHOD AND DEVICE FOR TREATING SURFACES USING A GLOW DISCHARGE PLASMA

(75) Inventors: Walter Schwarzenbach, Romont (CH); Bertrand Roessler, Marly (CH); Pierre Fayet, Lausanne (CH)

(73) Assignee: Tetra Pak (Suisse) S.A., Romont (CH)

( * ) Notice: Subject to any disclaimer, the term of this patent is extended or adjusted under 35 U.S.C. 154(b) by 98 days.

(21) Appl. No.: 10/381,148

(22) PCT Filed: Sep. 17, 2001

(86) PCT No.: PCT/CH01/00559

§ 371 (c)(1),
(2), (4) Date: Mar. 21, 2003

(87) PCT Pub. No.: WO02/25693

PCT Pub. Date: Mar. 28, 2002

(65) Prior Publication Data

US 2003/0185982 A1 Oct. 2, 2003

(30) Foreign Application Priority Data

Sep. 22, 2000 (CH) .............................................. 1850/00

(51) Int. Cl.[7] ................................................. H05H 1/24
(52) U.S. Cl. ........................ 427/569; 427/577; 427/578; 427/579; 118/723 E; 118/723 ER
(58) Field of Search ....................... 118/723 E, 723 ER; 427/569, 577, 578, 579

(56) References Cited

U.S. PATENT DOCUMENTS

| 4,539,068 A | * | 9/1985 | Takagi et al. ............... 427/570 |
| 4,634,601 A | | 1/1987 | Hamakawa et al. |
| 4,863,755 A | * | 9/1989 | Hess et al. .................... 427/574 |
| 5,185,132 A | | 2/1993 | Horiike et al. |
| 5,288,527 A | * | 2/1994 | Jousse et al. ............... 427/579 |
| 5,773,100 A | * | 6/1998 | Chang et al. ............... 427/579 |
| 5,908,565 A | | 6/1999 | Morita et al. |
| 5,980,999 A | * | 11/1999 | Goto et al. .................. 427/572 |
| 6,383,299 B1 | * | 5/2002 | Yuda et al. .................. 118/715 |

* cited by examiner

*Primary Examiner*—Bret Chen
(74) *Attorney, Agent, or Firm*—Rankin, Hill, Porter & Clark LLP

(57) ABSTRACT

In a process for treating a surface with the aid of a glow discharge plasma sustained in a gas of substantially ambient pressure between two electrodes (10, 10') unwanted effects of plasma filaments occurring in such a plasma are prevented by positioning the surface (17) to be treated in an edge region (14') of the plasma. The surface is placed on one side of a plasma space (14) defined by the electrode faces (11, 11') beyond a pair of aligned edges (13, 13') of the electrode faces (11, 11'), at a distance of a few millimeters from these edges (13, 13'), and facing these edges (13, 13'). The treatment gas or treatment gas mixture is fed to the plasma space (14) from a second side opposite the edge region (14') in which the surface (17) to be treated is positioned. During treatment, a substrate (16) whose one surface (17) is to be treated is either stationary or is advanced in a direction substantially perpendicular to the electrode faces (11, 11').

18 Claims, 2 Drawing Sheets

METHOD AND DEVICE FOR TREATING SURFACES USING A GLOW DISCHARGE PLASMA

BACKGROUND OF THE INVENTION

1. Field of the Invention

The present invention is directed toward a method and a device for treating surfaces with reactive particles generated in a glow discharge plasma, in particular for treating surfaces that are highly sensitive to thermal loading. The plasma used in the inventive method and device is a so-called one atmosphere glow discharge plasma, i.e. a plasma sustained in a gas at pressures in the range of ambient pressure (ca. 0.5 to 1.5 bar or 50,000 to 150,000 Pa).

2. Description of Related Art

Glow discharge plasmas are sustained in a gas, for example with the aid of an alternating electric field of a suitable voltage and frequency by which the gas is partially ionized to contain ions and electrons in addition to neutral atoms, molecules and radicals. The glow discharge plasma is usually sustained between two plate electrodes being correspondingly energized and having two substantially parallel electrode faces between which the plasma is located.

Surfaces are treated with reactive particles produced in a glow discharge plasma in order to, for example, change the surface energy (change of wettability), sterilize the surface, etch the surface, or deposit a material layer on the surface. The gas or gas mixture to be broken down in the plasma and possibly the plasma parameters are selected according to the desired effect of the plasma treatment.

Usually, the gas or gas mixture to be broken down in the plasma for the above-mentioned surface treatment processes has a reduced pressure in the order of 1 mbar (100 Pa) or less and the surface to be treated is either exposed to the plasma directly by being positioned between the two electrodes (direct plasma treatment) or it is positioned away from the plasma and the gas is made to flow from between the electrodes onto the surface to be treated (remote plasma treatment). Remote plasma treatment is chosen, for example, for geometric reasons, for shielding the surface to be treated from the light emission in the plasma, or for surface treatment with a selection only of the reactive particles occurring in the plasma (selection of longer living particles)

Reduced pressure glow discharge plasma has a relatively low power density and a high uniformity. Therefore, it is highly suited to treat surfaces sensitive to thermal loading. However, as the pressures used are very low, devices suitable for such surface treatment need to be vacuum tight and are correspondingly complicated and costly, particularly if large surfaces such as, for instance, webs of film are to be handled or if large amounts of items are to be handled with relatively short cycle times (without venting of a plasma chamber in each treatment cycle).

One exemplified application of surface treatment with the aid of a plasma is a process in which thin plastic film (e.g., low density polyethylene, polypropylene, amorphous or biaxial oriented polyester, cast or biaxially oriented polyamide with a film thickness of e.g. 80 $\mu$m) is coated with a layer of silicon oxide in order to reduce the gas permeability of the film (barrier layer). The process is a plasma enhanced vapor deposition process and the gas mixture contains beside oxygen and an inert gas such as a vaporized organosilicon compound. Similar processes are used for depositing barrier layers of silicon nitride, silicon carbide, or carbon (amorphous or crystalline). For the coating with carbon the treatment gas mixture contains light hydrocarbons such as methane, ethylene, ethane, etc.

Conventionally, for carrying out such processes a rotating drum serving as one electrode and a counter electrode with a correspondingly concave electrode face are arranged in a vacuum chamber and the plastic web is advanced between the two electrodes being positioned on the rotating drum while the gas mixture is fed to the space between the two electrodes. Usually, both a feed roll of film and a web roll for taking up the coated web are also positioned within the vacuum chamber.

It is also known that glow discharge plasmas can be sustained in gases at substantially ambient pressure. Plasma sustained in air of ambient pressure is used for producing ozone For this process it does not matter that such one atmosphere plasmas are highly filamentary which, however, renders them unsuitable for surface treatment, in particular for treatment of sensitive surfaces. In U.S. Pat. Nos. 5,387,842; 5,456,972; 5,403,453; and, 5,414,324, the disclosures of which are expressly incorporated herein in their entireties, the University of Tennessee Research Corporation discloses methods for producing more uniform one atmosphere glow discharge plasmas (plasmas sustained in a gas of substantially ambient pressure). The uniformity of these plasmas is achieved by carefully matching voltage and frequency to the character and the pressure of the used gas or gas mixture. According to the disclosure, such plasmas are suitable for treating surfaces by positioning the surface to be treated between two correspondingly energized plate electrodes.

However, it shows that the uniformity of such one atmosphere plasmas is very sensitive to small parameter changes (power, frequency, gas composition, gas pressure, geometry etc.) such that it is hardly possible to sustain such a plasma in a continuously working system over a longer period of time strictly without filaments. According to a later publication of the University of Tennessee Research Corporation (WO-99/40758), "it becomes difficult to prevent occasional plasma filaments from developing at the edges of the workpiece, the electrode edges, or the edges of the web when a workpiece is directly exposed to the plasma", i.e. when the workpiece is positioned between the two plate electrodes. Such occasional filaments become particularly troublesome in the above-named barrier coating application in which each filament punches a hole into the plastic film resulting in a hole in the produced barrier coating also and, therefore, resulting in a leak which, even if microscopically small, outweighs the effect of the barrier layer over a large area of the coated surface. Therefore, it seems hardly possible to achieve top quality barrier properties in a direct plasma treatment using a one atmosphere plasma.

For this reason, the named publication WO-99/40758 suggests to treat surfaces with reactive particles generated in a one atmosphere glow discharge plasma in remote plasma processes, in particular in the case of thin and heat-sensitive plastic films and fabrics. However, this again renders a device for carrying out the process more complicated and restricts the availability of some of the reactive particles, in particular the availability of very short lived particles.

SUMMARY OF THE INVENTION

It is an object of the invention to create a method and a device for surface treatment using a one atmosphere glow discharge plasma that will reduce the disadvantage of direct plasma exposure as used according to the state of the art (exposure between the electrodes) without the complications of remote exposure as used according to the state of the art. Method and device according to the invention are to be suitable in particular for treating a surface of thin plastic film material, in particular for coating such film material, which is in the form of a web, with a barrier layer. The method and device according to the invention are to be simple and are to allow high quality treatment, particularly treatment without the negative effects of plasma filaments.

According to the inventive method, the surface to be treated is not positioned in the space between the two plate electrodes used for sustaining the plasma. Rather, the surface to be treated is placed just outside of the space between the two electrode plates, i.e. to one side of the space between the electrode faces, beyond two aligned edges of the electrode faces, at a small distance from these edges and facing these edges. This means that the surface to be treated is positioned in an edge region of the plasma in which the alternating electric field has a power density sufficient for sustaining the plasma but in which the field lines do not extend at right angles to the electrode faces, but rather are curved between the two aligned edges of the two electrode faces (fringing field).

The treatment gas or treatment gas mixture is advantageously fed to the space between the electrode faces from an edge region opposite to the location of the surface to be treated and flows towards the surface to be treated.

The inventive device comprises two plate electrodes. These plates are temperature controlled (i.e. kept at a predetermined temperature (−80 to 300° C.)) and have a dielectric coating of high dielectric strength (10 to 80 kV/mm). The faces of the two electrodes are facing each other substantially in parallel and have at least one pair of aligned edges. The device further comprises means for energizing the two plate electrodes with an alternating voltage suitable for braking down a treatment gas or treatment gas mixture at substantially ambient pressure to form a plasma in the space between the electrode faces. This plasma visibly extends not only in the space between the electrode faces but also in an edge region protruding beyond pairs of aligned edges of the electrode faces The device further comprises positioning means for positioning a substrate with a surface to be treated such that the named surface is located in an edge region of the plasma and is facing towards the space between the electrodes. The feed means for feeding the treatment gas or treatment gas mixture to the space between the two electrode faces advantageously from a side of this space opposite to the position of the surface to be treated.

The surface to be treated may be positioned at any angle relative to the electrode faces. Advantageously, the surface to be treated is positioned substantially perpendicular to the electrode faces, in parallel with a pair of aligned edges of the two electrode faces and at a small distance of a few millimeters (1 to 10 mm) from these. A small surface to be treated may be positioned stationary in this edge region of the plasma for a time sufficient for the desired plasma treatment. A larger surface is advantageously advanced continuously in a direction substantially perpendicular to the electrode faces and at a speed sufficiently small for exposing each part area of the surface to be treated to the plasma for a time sufficient for the desired plasma treatment.

If the substrate to be treated is a web of film material it is advantageous to design the positioning means of the inventive device as a rotating drum and advancing the web positioned on the circumferential surface of the drum through the edge region of the plasma space. The electrode pair is arranged relative to this drum such that the electrode faces extend substantially radially from the drum and the aligned pair of edges of the two electrode faces extends parallel to the drum axis at a length corresponding at least to the width of a web to be treated. The distance between the circumferential surface of the drum and the aligned edges of the electrode faces facing towards the drum is chosen such that the substrate positioned on the drum is advanced through the edge region of the plasma space, i.e. at a few millimeters distanced from the aligned edges. At least the circumferential surface of the rotating drum is made of an electrically insulating material. A metal drum body is electrically grounded, floating or kept at a predetermined voltage by suitable means. Furthermore, the drum has a controlled temperature suitable for the material to be treated.

Experiments show that positioning a surface to be treated as described above in the edge region of the plasma space (fringing field) reduces damage caused by plasma filaments drastically and still allows treating speeds (e.g. deposition rates) that are in the same order of magnitude as for plasma exposure between the electrodes.

When coating a thin plastic film with a barrier layer of, for example, silicon oxide, silicon nitride, silicone carbide, or carbon (amorphous or crystalline) according to the inventive method the coated film material has a constant and high barrier quality. The constancy of the barrier quality is thought to be due to the absence of plasma filaments in the edge region of the plasma space in which the surface to be treated is exposed to the plasma. Due to the absence of plasma filaments, damage to the substrate and the coating is prevented and deposition is highly regular.

For a surface treatment necessitating a relatively long exposure time, it is advantageous to arrange a plurality of electrode pairs in succession around the section of the drum circumferential surface carrying the web to be treated so as to carry out the plasma treatment in successive treatment steps. It is also possible to vary the gas or gas mixture used in the successive treatment steps and thereby achieving a multistep treatment consisting of, for example, a surface pretreatment step followed by a plurality of coating steps in which a plurality of different layers are deposited on top of each other on the substrate surface.

However, the inventive method is not only applicable for coating surfaces in a plasma enhanced deposition process, but also in other plasma enhanced processes such as, for example, per se known processes for modification of surface energy in order to improve wetability, ink printing, or subsequent coating or processes for decontaminating, cleaning or sterilizing surfaces, in particular heat-sensitive surfaces

BRIEF DESCRIPTION OF THE DRAWINGS

The inventive device is described in detail in connection with the following Figures, wherein.

DETAILED DESCRIPTION OF THE PREFERRED EMBODIMENTS

Figure 1:
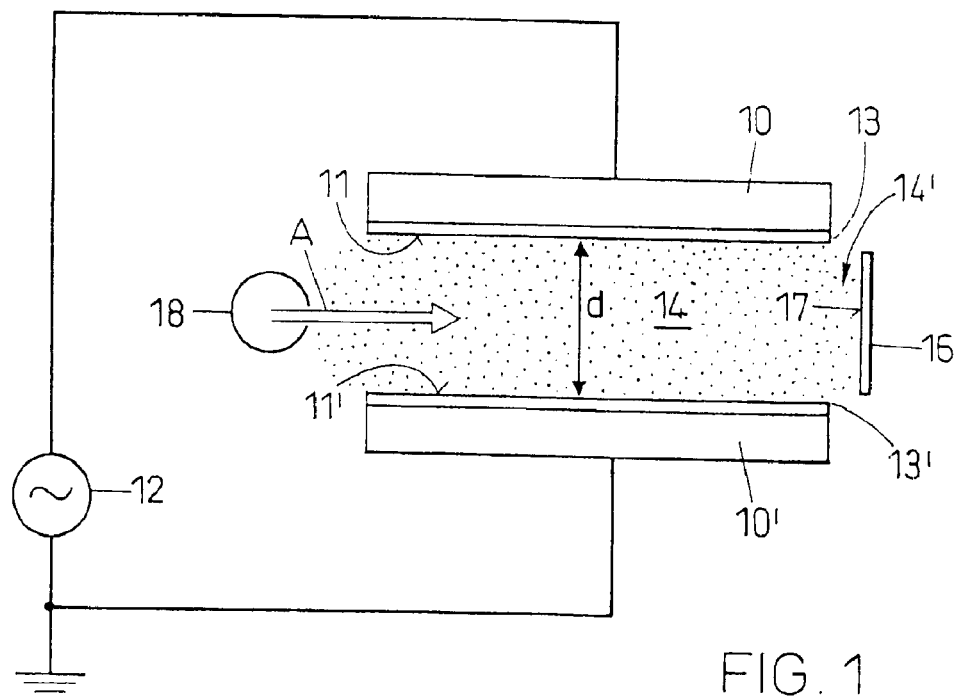
FIG. 1 schematically shows a plasma sustained between two plate electrodes and the position of a surface to be treated according to the inventive method as well as an advantageous position for the gas feed means.

FIG. 1 shows the principle of the inventive method. Between two plate electrodes 10 and 10' with two electrode faces 11 and 11' being arranged substantially parallel to each other at a distance d between each other a plasma is lighted and sustained by energizing the electrodes with per se known suitable energizing means 12 comprising, for example, a power supply, high voltage transformer, and matching network. The electrode faces 11 and 11' have aligned edges, in particular one pair of such aligned edges 13 and 13'. The aligned edges 13, 13' of the two electrode faces 11, 11' define a plasma space 14 between them. whereby the plasma sustained between the two electrode faces 11 and 11' visibly protrudes over pairs of aligned edges 13 and 13' of the electrode faces in edge regions 14' (fringing field).

The device further comprises means 18 for feeding a treatment gas or treatment gas mixture to the plasma space 14, 14' and means for positioning a substrate 16 with a surface 17 to be treated. The positioning means is designed for positioning the surface 17 to be treated within an edge region 14' of the plasma space and facing towards the space between the electrodes 10 and 10'. Advantageously, the surface 17 to be treated is positioned substantially perpendicular to the electrode faces 11 and 11' and substantially parallel to the nearest pair of aligned edges 13 and 13'.

The feed means 18 are designed for feeding a treatment gas or treatment gas mixture (arrow A) to the plasma space 14. 14' from a side opposite the edge region 14' in which the surface 17 to be treated is positioned, as illustrated. Advantageously, the gas is made to flow from the feed means 18 towards the surface 17 to be treated (arrow A). The feed means 18 is, for example, a gas feed tube running parallel to a pair of aligned edges of the electrode faces and having equidistanced or equally-spaced gas exit openings. For feeding a gas mixture it might be advantageous to provide a plurality of parallel feed tubes for separately feeding components of the mixture.

Figure 2:
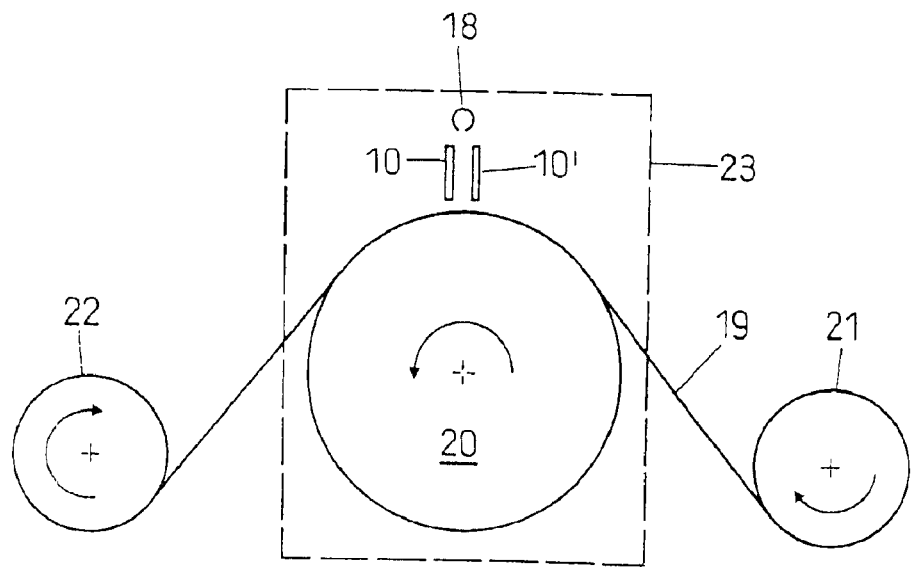
FIG. 2 schematically shows an exemplified embodiment of the inventive device designed for plasma treating one surface of a web in a continuous process.

FIG. 2 shows an exemplified embodiment of the inventive device the embodiment being suitable for plasma treating one surface of a web material 19 The device comprises as discussed above a pair of electrodes 10 and 10' and a gas feed tube 18. It further comprises a rotating drum 20 serving as means for positioning the surface to be treated in an edge region of the plasma being sustained between the electrodes 10 and 10'. The web is fed to the drum from a feed roll 21, runs over part of the circumferential surface of the drum 20 to be treated in the edge region of the plasma being sustained between the electrodes 10 and 10', and, after treatment, is rolled up on the roll 22.

If the treatment gas is not air and the presence of air is having a negative effect on the treatment, the device, or at least a part of the device, can be encased in a housing 23 comprising exhaust means. In most cases, however, it will not be necessary to seal the housing and in no case is it necessary to design the housing to be vacuum tight.

Figure 3:
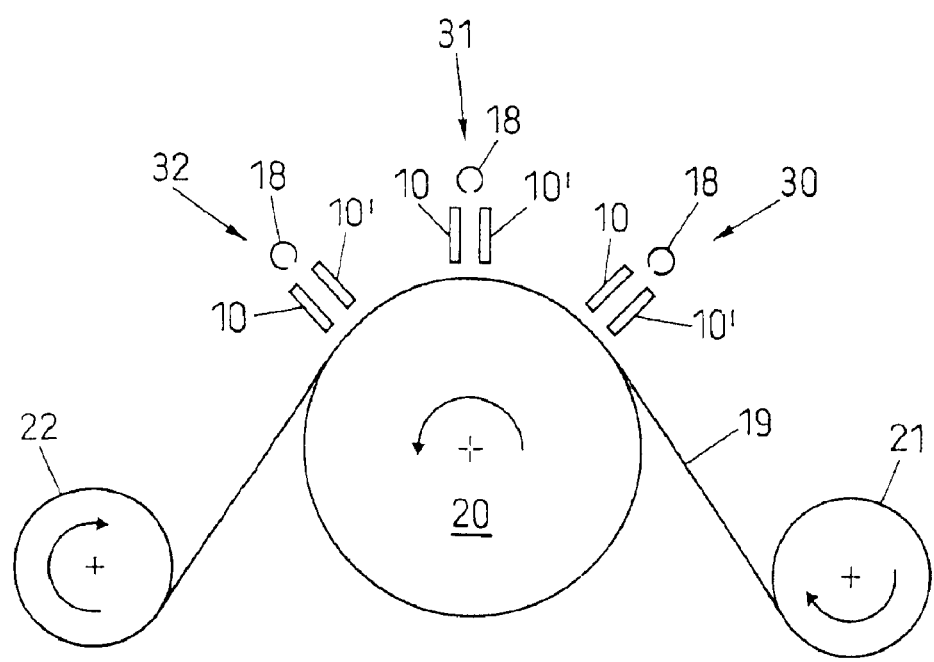
FIG. 3 schematically shows a further exemplified embodiment of the inventive device designed for a multistep treatment of one surface of a web.

FIG. 3 shows a further exemplified embodiment of the inventive device. This device is similar to the device according to FIG. 2 with the exception that instead of only one pair of electrodes for sustaining a plasma it comprises three such pairs 30, 31 and 32 and is suitable for treating a web 19 in a three step plasma treatment process, the three steps being the same or different from each other.

A device designed substantially as illustrated in FIG. 2 is operated with the following parameters:

| | |
|---|---|
| Distance between electrode faces: | 1 to 10 mm |
| Distance between edge of electrode faces and surface to be treated: | 1 to 10 mm |
| Applied voltage: | 10 to 20 kV |
| Applied frequency: | 1 to 10 kHz |
| Gas mixture for silicon oxide deposition: | oxygen, nitrogen, hexamethyldisiloxane |

Results for silicon oxide barrier coating deposition on PET film of 12 µm thickness:

| | |
|---|---|
| Thickness of coating: | 30–130 nm |
| Oxygen permeation without coating: | 120 cm$^3$/(day m$^2$ atm) |
| Oxygen permeation with coating: | 20 to 0.01 cm$^3$/(day m$^2$ atm) |

The oxygen permeation of a film with a barrier layer deposited according to the inventive method with the aid of atmospheric plasma compares well with the permeation of corresponding coatings deposited with the aid of vacuum plasma. It is at least twenty times better than permeation of the same film with a barrier layer produced in atmospheric plasma with the substrate being positioned between the electrodes.

What is claimed is:

1. A method for treating a surface (17) with aid of a treatment gas or treatment gas mixture, comprising the steps of:
   breaking down said treatment gas or treatment gas mixture in a glow discharge plasma reaction sustained in a plasma space between two substantially parallel opposite faces (11, 11') of two suitably energized electrodes (10, 10'), said electrode faces having aligned edges, whereby a plasma sustained between said electrodes includes an edge region that extends away from said plasma space and beyond the aligned edges of said electrodes;
   positioning the surface (17) to be treated in the edge region (14') of the plasma, said surface (17) facing towards said aligned electrode edges (13, 13') and being positioned at a distance from said aligned electrode edges (13, 13'), wherein a power density in the edge region (14') is sufficient for sustaining the plasma.

2. The method according to claim 1, wherein the treatment gas or treatment gas mixture has a pressure of between 50,000 and 150,000 Pa.

3. The method according to claim 1, comprising the further steps of:
   feeding the treatment gas or treatment gas mixture to the plasma space (14) from a side opposite the edge region (14') in which the surface (17) to be treated is positioned; and,
   flowing the treatment gas or treatment gas mixture through the plasma space (14) towards the surface (17) to be treated.

4. The method according to claim 1, wherein the surface (17) to be treated is positioned in the edge region (14') substantially perpendicularly to the faces (11, 11') of the electrodes (10, 10').

5. The method according to claim 4, comprising the further step of advancing the surface (17) to be treated in a direction perpendicular to the electrode faces (11, 11') during treatment.

6. The method according to claim 5, wherein the surface (17) to be treated is one of two surfaces of a web (19) of plastic film.

7. The method according to claim 1, wherein at least one component of the treatment gas mixture is fed to the plasma space (14) separately from other components of the treatment gas mixture.

8. The method according to claim 1, wherein the surface treatment is a chemical vapor deposition in which a barrier layer selected from the group consisting of silicon oxide, silicon nitride, silicon carbide and carbon is deposited.

9. The method according to claim 1, wherein the surface treatment is a multistep vapor deposition in which a plurality of layers are deposited.

10. The method according to claim 1, wherein the surface treatment is accomplished by one of surface energy modification, surface decontamination, surface cleaning, and surface sterilization.

11. A device for treating a surface (17) with aid of a glow discharge plasma being sustained between two plate electrodes (10, 10'), the device comprising at least first and second electrodes (10, 10') with one electrode face (11, 11') each, the two electrodes (10, 10') being arranged such that the electrode face of the first electrode is directed toward the electrode face of the second electrode and such that the electrode faces are substantially parallel to each other and define a plasma space (14) therebetween, said faces of said first and second electrodes having edges that are aligned with one another, and the device further comprising means (12) for energizing the first and second electrodes in order to break down a gas in the plasma space between the faces (11, 11') of the electrodes (10, 10') so as to form the glow discharge plasma, said plasma including an edge region that extends away from said plasma space and the aligned edges of the electrode faces, said device further comprising means for feeding a treatment gas or a treatment gas mixture to the space between the electrode faces (10, 10') and means for positioning the surface (17) to be treated in the plasma, wherein the positioning means are designed for positioning the surface (17) to be treated in the edge region beyond the aligned edges (13, 13') of the electrode faces (11, 11') and at a distance from said aligned edges (13, 13') and facing toward said aligned edges (13, 13'), said distance being matched to device parameters such that the plasma is sustained in the position of the surface to be treated.

12. The device according to claim 11, wherein the positioning means Is designed such that the distance between the surface (17) to be treated and the aligned edges (13, 13') is between 1 and 10 mm.

13. The device according to claim 11, wherein the positioning means is on a first side of the plasma space and the feed means feed the treatment gas or treatment gas mixture to the plasma space (14, 14') from a second, opposite side of the plasma space (14) and direct the gas or gas mixture in a direction (A) toward the first side.

14. The device according to claim 11, wherein the positioning means is designed to continuously advance the surface (17) to be treated in a direction substantially perpendicular to the electrode faces (11, 11').

15. The device according to claim 14, wherein the positioning means is a rotating drum (20) and the electrode faces (11, 11') are oriented substantially radially relative to the drum (20).

16. The device according to claim 11, wherein the feed means is at least one feed tube (18) arranged parallel to the electrode faces (11,11') and having feed holes directed towards the plasma space (14).

17. The device according to claim 11, wherein said device is used for coating a plastic film with a barrier layer selected from the group consisting of silicon oxide, silicon nitride, silicon carbide and carbon in a plasma enhanced chemical vapor deposition process.

18. The device according to claim 11, wherein said device is used for coating a web of plastic film with a barrier layer selected from the group consisting of silicon oxide, silicon nitride, silicon carbide and carbon in a continuous plasma enhanced chemical vapor deposition process.

* * * * *